(12) United States Patent
Shin et al.

(10) Patent No.: US 12,564,059 B2
(45) Date of Patent: Feb. 24, 2026

(54) SEMICONDUCTOR DEVICE AND METHOD OF FORMING GRAPHENE CORE SHELL EMBEDDED WITHIN SHIELDING LAYER

(71) Applicant: STATS ChipPAC Pte. Ltd., Singapore (SG)

(72) Inventors: YongMoo Shin, Incheon (KR); SuJeong Kwon, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 569 days.

(21) Appl. No.: 18/046,028

(22) Filed: Oct. 12, 2022

(65) Prior Publication Data

US 2024/0128200 A1 Apr. 18, 2024

(51) Int. Cl.
H01L 23/552 (2006.01)
H01L 21/56 (2006.01)
(Continued)

(52) U.S. Cl.
CPC ............ H01L 23/552 (2013.01); H01L 21/56 (2013.01); H01L 23/3128 (2013.01);
(Continued)

(58) Field of Classification Search
CPC ... H01L 23/552; H01L 21/56; H01L 23/3128; H01L 23/5383; H01L 24/16;
(Continued)

(56) References Cited

U.S. PATENT DOCUMENTS 6,114,413 A 9/2000 Kang et al.
7,659,145 B2 2/2010 Do et al.
(Continued)

FOREIGN PATENT DOCUMENTS

CN 110071074 A 7/2019
KR 10-1465616 B1 11/2014
(Continued)

OTHER PUBLICATIONS

Graphmatech, "Graphmatech's Graphene Technology Unlocks the Potential of Copper Additive Manufacturing" Website: https://graphmatech.com/graphmatechs-graphene-technology-unlocks-the-potential-of-copper-additive-manufacturing/, Feb. 9, 2021, Uppsala, Sweden.

(Continued)

*Primary Examiner* — Marlon T Fletcher
*Assistant Examiner* — Christina A Sylvia
(74) *Attorney, Agent, or Firm* — Robert D. Atkins; PATENT LAW GROUP: Atkins and Associates, P.C.

(57) ABSTRACT

A semiconductor device has a substrate and an electrical component disposed over the substrate. An encapsulant is deposited over the electrical component and substrate. A shielding layer has a graphene core shell formed on a surface of the encapsulant. The shielding layer can be printed on the encapsulant. The graphene core shell includes a copper core. The shielding layer has a plurality of cores covered by graphene and the graphene is interconnected within the shielding layer to form an electrical path. The shielding layer also has thermoset material or polymer or composite epoxy type matrix and the graphene core shell is embedded within the matrix. A shielding material can be disposed around the electrical component. The electrical path dissipates any charge incident on shielding layer, such as an ESD event, to reduce or inhibit the effects of EMI, RFI, and other inter-device interference.

25 Claims, 12 Drawing Sheets

(51) Int. Cl.
*H01L 23/31* (2006.01)
*H01L 23/00* (2006.01)
*H01L 23/538* (2006.01)

(52) U.S. Cl.
CPC .......... *H01L 23/5383* (2013.01); *H01L 24/16* (2013.01); *H01L 2224/16227* (2013.01)

(58) Field of Classification Search
CPC ....... H01L 2224/16227; H01L 25/0655; H01L 25/50; H01L 23/3121; H01L 21/48; H01L 23/544; H01L 21/565; H01L 23/29; H05K 9/0086
See application file for complete search history.

(56) References Cited

U.S. PATENT DOCUMENTS

| | | | |
|---|---|---|---|
| 7,700,943 B2 | 4/2010 | Raravikar et al. | |
| 7,886,813 B2 | 2/2011 | Hua et al. | |
| 7,989,707 B2 | 8/2011 | Yamano et al. | |
| 8,106,495 B2 | 1/2012 | Kajiki | |
| 8,107,242 B2 | 1/2012 | Yoshimoto et al. | |
| 8,263,439 B2 | 9/2012 | Marimuthu et al. | |
| 8,421,232 B2 | 4/2013 | Ikeda et al. | |
| 8,535,553 B2 | 9/2013 | Kong et al. | |
| 8,623,753 B1 | 1/2014 | Yoshida et al. | |
| 8,643,185 B2 | 2/2014 | Kajiwara et al. | |
| 8,710,649 B1 | 4/2014 | Huemoeller et al. | |
| 8,927,334 B2 | 1/2015 | Daubenspeck et al. | |
| 9,070,677 B2 | 6/2015 | Park | |
| 9,105,613 B1 | 8/2015 | Chen et al. | |
| 9,144,183 B2 | 9/2015 | Chen et al. | |
| 9,202,742 B1 | 12/2015 | Kim et al. | |
| 9,305,854 B2 | 4/2016 | Shim et al. | |
| 9,337,073 B2 | 5/2016 | Liu et al. | |
| 9,406,533 B2 | 8/2016 | Chi et al. | |
| 9,576,922 B2 | 2/2017 | Brunschwiler et al. | |
| 9,698,075 B2 | 7/2017 | Venugopal et al. | |
| 9,780,071 B2 | 10/2017 | Lee et al. | |
| 9,859,200 B2 | 1/2018 | Park et al. | |
| 9,916,989 B2 | 3/2018 | Yoon et al. | |
| 10,287,471 B2 | 5/2019 | Zhang et al. | |
| 10,322,472 B2 | 6/2019 | Hattori et al. | |
| 10,340,154 B2 | 7/2019 | Kamikoriyama et al. | |
| 10,421,123 B2 | 9/2019 | Jeong et al. | |
| 10,510,733 B2 | 12/2019 | Kumar et al. | |
| 10,566,104 B2 | 2/2020 | Lee et al. | |
| 10,600,743 B2 | 3/2020 | Lee et al. | |
| 10,784,181 B2 | 9/2020 | Fu et al. | |
| 10,854,549 B2 | 12/2020 | Nakano | |
| 10,867,936 B2 | 12/2020 | Wang et al. | |
| 10,872,879 B2 | 12/2020 | Kim et al. | |
| 11,437,308 B2 | 9/2022 | Rho et al. | |
| 11,652,060 B2 | 5/2023 | Gomes et al. | |
| 11,810,844 B2 | 11/2023 | Mok | |
| 12,388,029 B2 | 8/2025 | Yim et al. | |
| 2002/0104669 A1 | 8/2002 | Underwood et al. | |
| 2006/0007661 A1 | 1/2006 | Iketaki | |

| | | | |
|---|---|---|---|
| 2009/0096100 A1 | 4/2009 | Kajiwara et al. | |
| 2009/0152715 A1 | 6/2009 | Shim et al. | |
| 2010/0109688 A1 | 5/2010 | Eldridge et al. | |
| 2010/0129648 A1 | 5/2010 | Xu et al. | |
| 2011/0006425 A1 | 1/2011 | Wada et al. | |
| 2012/0018897 A1 | 1/2012 | Park et al. | |
| 2012/0132930 A1 | 5/2012 | Young et al. | |
| 2013/0056703 A1 | 3/2013 | Elian et al. | |
| 2013/0075923 A1 | 3/2013 | Park et al. | |
| 2013/0082364 A1* | 4/2013 | Wang ................. H01L 25/0655 257/659 |
| 2014/0024211 A1 | 1/2014 | Ott et al. | |
| 2014/0103527 A1 | 4/2014 | Mariumuthu et al. | |
| 2015/0179602 A1 | 6/2015 | Camacho et al. | |
| 2016/0039662 A1 | 2/2016 | Lin et al. | |
| 2016/0137507 A1 | 5/2016 | You et al. | |
| 2016/0286698 A1 | 9/2016 | Chang et al. | |
| 2017/0033086 A1 | 2/2017 | Homma et al. | |
| 2017/0130034 A1 | 5/2017 | Hwang et al. | |
| 2017/0167716 A1 | 6/2017 | Ezaki et al. | |
| 2018/0323170 A1 | 11/2018 | Kim et al. | |
| 2018/0346679 A1* | 12/2018 | Shishkin ................. H01B 1/24 |
| 2019/0139902 A1* | 5/2019 | Lee ....................... H01L 21/561 |
| 2019/0181082 A1 | 6/2019 | Chen et al. | |
| 2019/0206839 A1 | 7/2019 | Balakrishnan et al. | |
| 2019/0259685 A1 | 8/2019 | Hussain et al. | |
| 2019/0348344 A1 | 11/2019 | Lu et al. | |
| 2019/0382627 A1 | 12/2019 | Hu et al. | |
| 2019/0394898 A1 | 12/2019 | Manninen et al. | |
| 2020/0002176 A1 | 1/2020 | Gorton | |
| 2020/0075502 A1 | 3/2020 | Kim et al. | |
| 2020/0161252 A1 | 5/2020 | Yang et al. | |
| 2020/0227338 A1 | 7/2020 | Gong | |
| 2020/0388552 A1 | 12/2020 | Chou et al. | |
| 2021/0005512 A1 | 1/2021 | Liu et al. | |
| 2021/0028122 A1 | 1/2021 | Son et al. | |
| 2021/0151357 A1 | 5/2021 | Cook et al. | |
| 2021/0257346 A1 | 8/2021 | Baloglu et al. | |
| 2022/0002157 A1 | 1/2022 | Corrigan et al. | |
| 2022/0066703 A1 | 3/2022 | Hayes | |
| 2022/0359418 A1 | 11/2022 | Jung et al. | |
| 2023/0323067 A1 | 10/2023 | Yoshida et al. | |
| 2024/0096736 A1 | 3/2024 | Shin et al. | |
| 2024/0153783 A1 | 5/2024 | Lee et al. | |

FOREIGN PATENT DOCUMENTS

| | | |
|---|---|---|
| KR | 20150142090 A | 12/2015 |
| KR | 10-1895114 | 9/2018 |
| KR | 10-2395247 B1 | 5/2022 |
| WO | 2022113729 A1 | 6/2022 |

OTHER PUBLICATIONS

Yu Seong Lee, Laser-Sintered Silver Nanoparticles as a Die Adhesive Layer for High-Power Light-Emitting Diodes, IEEE Transactions on Components, Packaging and Manufacturing Technology. Vol. 4, No. 7, Jul. 2014, pp. 1119-1124.

* cited by examiner

SEMICONDUCTOR DEVICE AND METHOD OF FORMING GRAPHENE CORE SHELL EMBEDDED WITHIN SHIELDING LAYER

FIELD OF THE INVENTION

The present invention relates in general to semiconductor devices and, more particularly, to a semiconductor device and method of forming a graphene core shell embedded within a shielding layer.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate.

The SIP module includes high speed digital and RF electrical components, highly integrated for small size and low height, and operating at high clock frequencies and high power rating. An electromagnetic shielding material is commonly conformally applied over the encapsulant. The electromagnetic shielding material reduces or inhibits electromagnetic interference (EMI), radio frequency interference (RFI), and other inter-device interference, for example as radiated by high-speed digital devices, from affecting neighboring devices within or adjacent to SiP module.

The shielding material can be made with copper (Cu) as a cost-effective material with reasonable electrical conductivity. Unfortunately, Cu shielding is subject to oxidation in the atmosphere. A shielding layer robust to the environment with even better electrical conductivity is desired.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
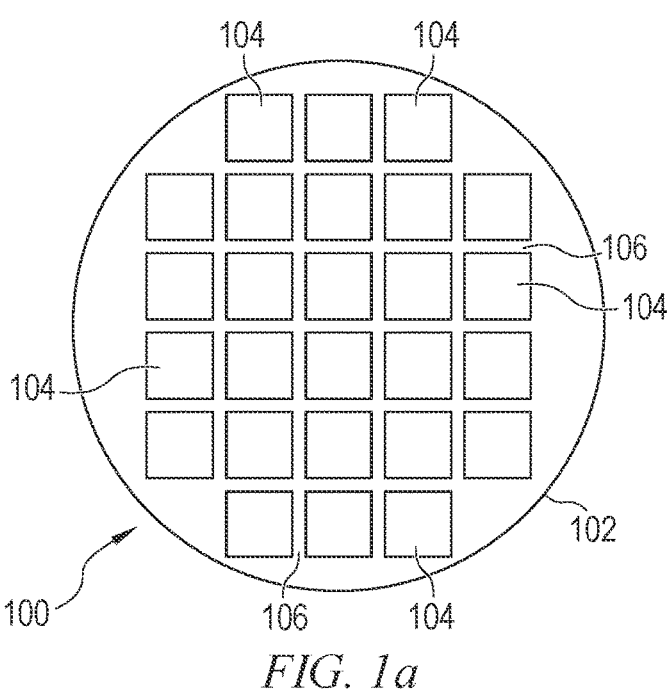
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
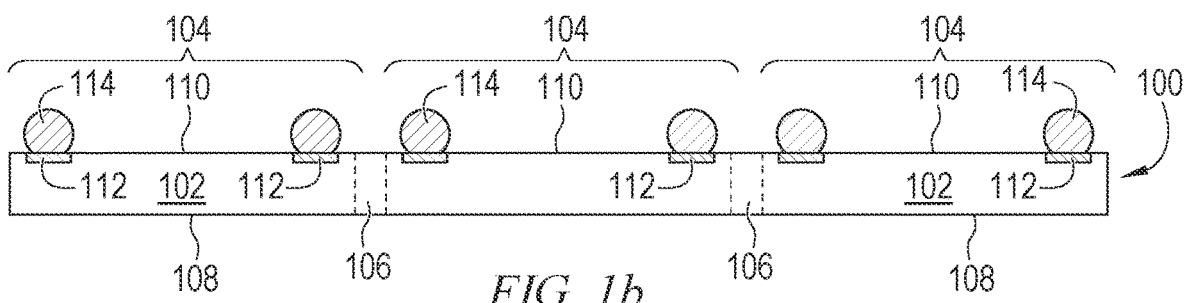

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 2A:
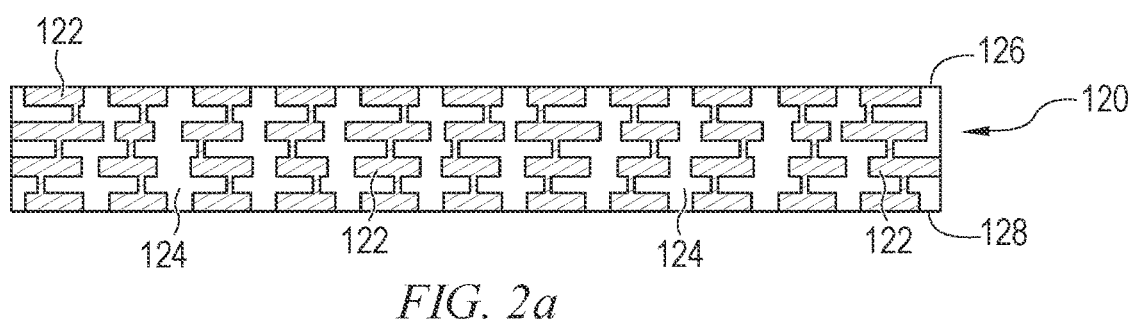
FIGS. 2a-2e illustrate a process of forming a graphene core shells within a shielding layer for an SiP.

FIGS. 2a-2e illustrate a process of forming an SiP module with graphene core shells within a shielding layer to reduce or inhibit the effects of EMI, RFI, and other inter-device interference. FIG. 2a shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

Figure 1C:
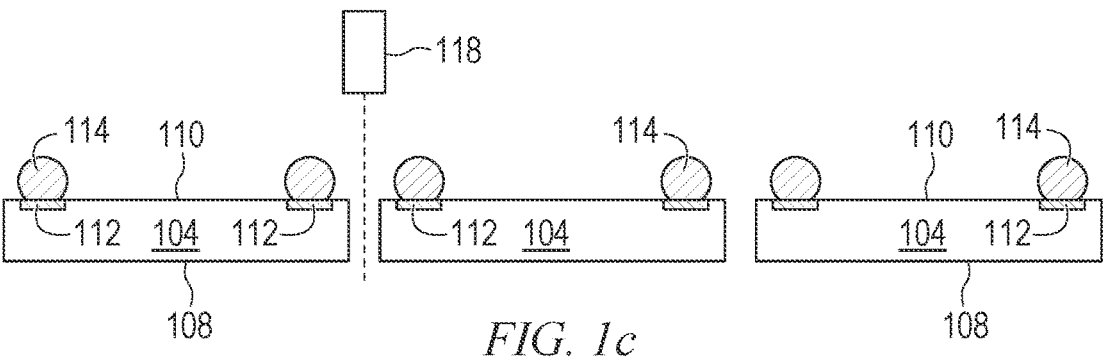
Figure 2B:
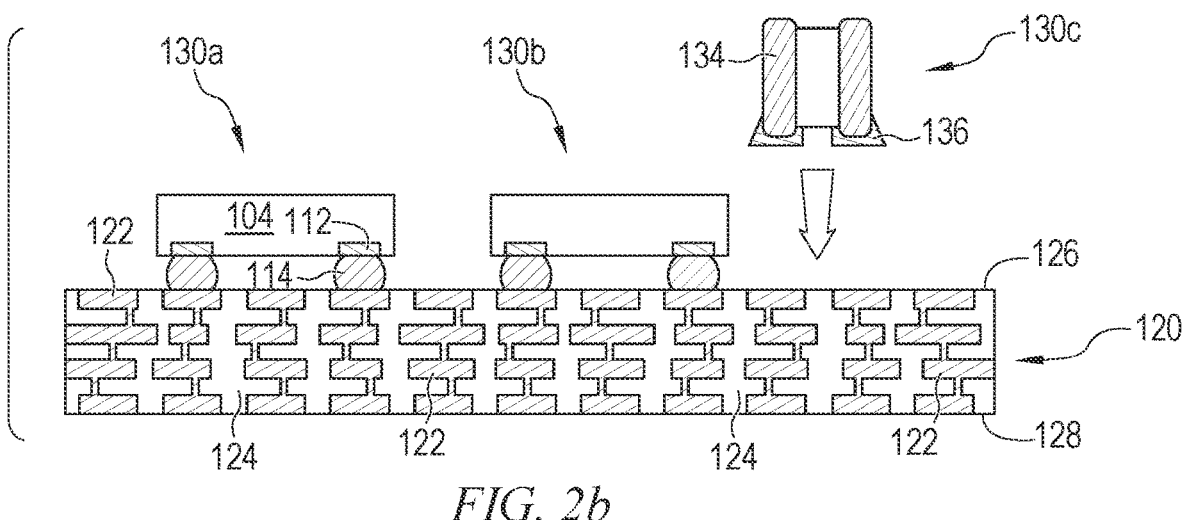

In FIG. 2b, electrical components 130a-130c are disposed on surface 126 of interconnect substrate 120 and electrically and mechanically connected to conductive layers 122. Electrical components 130a-130c are positioned over substrate 120 using a pick and place operation. For example, electrical components 130a and 130b can be, or similar to, semiconductor die 104 from FIG. 1c with bumps 114 oriented toward surface 126 of substrate 120. Electrical component 130c can be discrete electrical devices, or IPDs, such as a diode, transistor, resistor, capacitor, and inductor. Alternatively, electrical components 130a-130c can include other semiconductor die, semiconductor packages, surface mount devices, RF components, discrete electrical devices, or integrated passive devices (IPD).

Figure 2C:
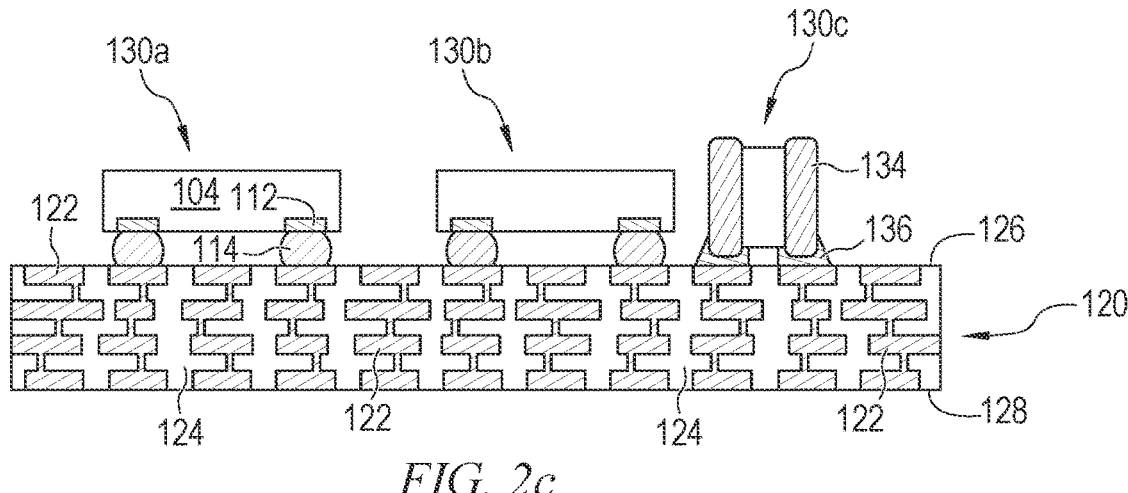

Electrical components 130a-130c are brought into contact with conductive layer 122 on surface 126 of substrate 120. Electrical components 130a and 130b are electrically and mechanically connected to conductive layer 122 by reflowing bumps 114. Terminals 134 of electrical component 130c is electrically and mechanically connected to conductive layer 122 using solder or conductive paste 136. FIG. 2c illustrates electrical components 130a-130c electrically and mechanically connected to conductive layers 122 of substrate 120.

Figure 2D:
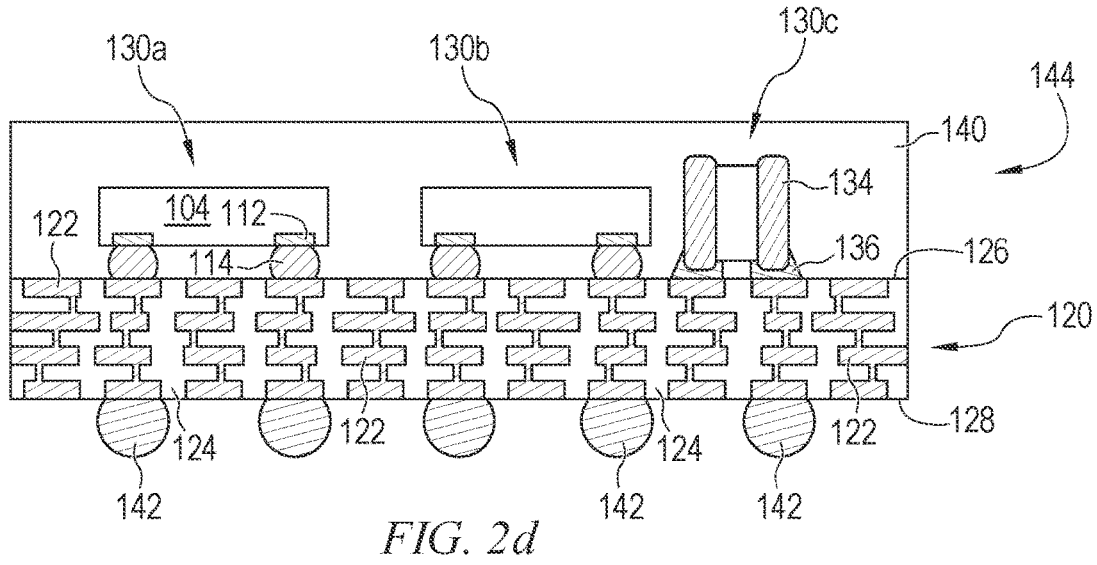

In FIG. 2d, encapsulant or molding compound 140 is deposited over and around electrical components 130a-130c and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 142. In one embodiment, bump 142 is formed over an under bump metallization (UBM) having a wetting layer, barrier layer, and adhesive layer. Bump 142 can also be compression bonded or thermocompression bonded to conductive layer 122. In one embodiment, bump 142 is a copper core bump for durability and maintaining its height. Bump 142 represents one type of interconnect structure that can be formed over conductive layer 122. The interconnect structure can also use bond wires, conductive paste, stud bump, micro bump, or other electrical interconnect. The combination of substrate 120, electrical components 130a-130c, and encapsulant 140 constitutes system-in-package (SiP) 144.

Electrical components 130a-130c may contain IPDs that are susceptible to or generate EMI, RFI, harmonic distortion, and inter-device interference. For example, the IPDs contained within electrical components 130a-130c provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130c contain digital circuits switching at a high frequency, which could interfere with the operation of other IPDs.

Figure 2E:
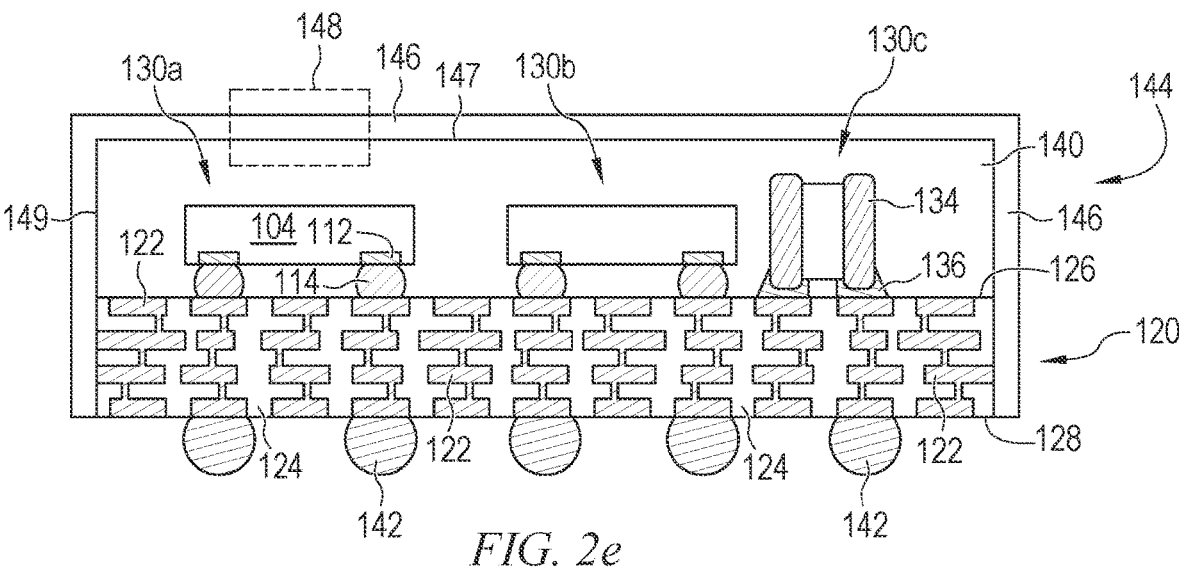

To address EMI, RFI, harmonic distortion, and inter-device interference and continuing from FIG. 2c, a shielding layer or frame 146 is formed over surface 147 of encapsulant 140 to reduce or inhibit the effects of EMI, RFI, and other inter-device interference, as shown in FIG. 2e. Shielding layer 146 further extends down side surfaces 149 of encapsulant to electrically connect to conductive layer 122 of substrate 120. Further detail of shielding layer 146 is provided infra.

Figure 3A:
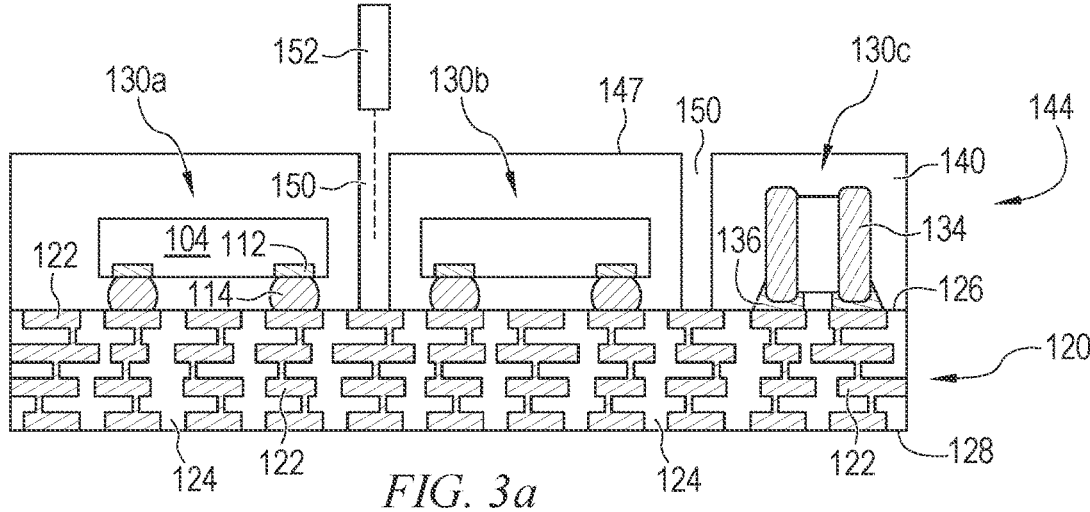
FIGS. 3a-3d illustrate a process of forming a graphene core shell within a compartmentalized shielding layer.
Figure 3B:
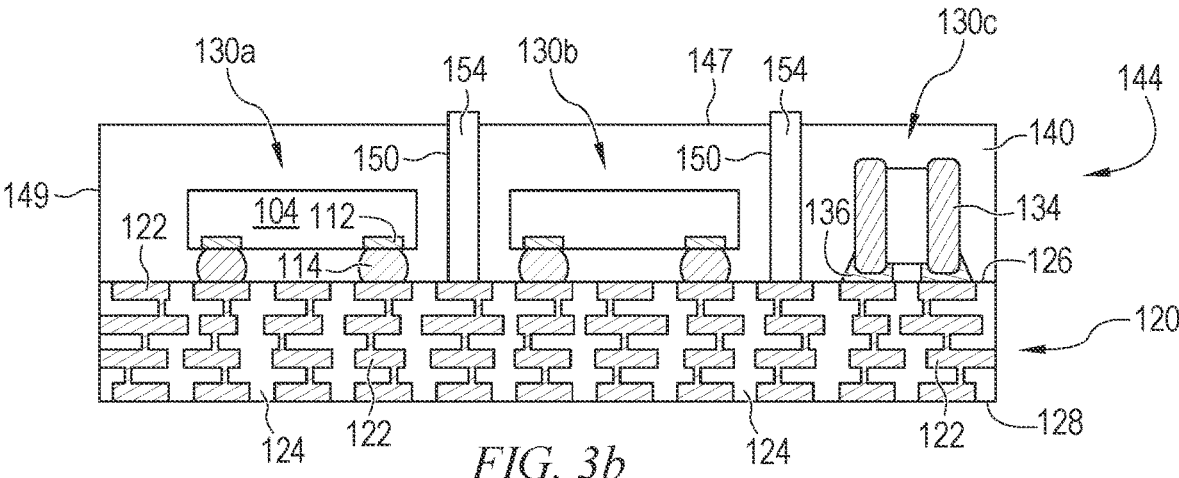
Figure 3C:
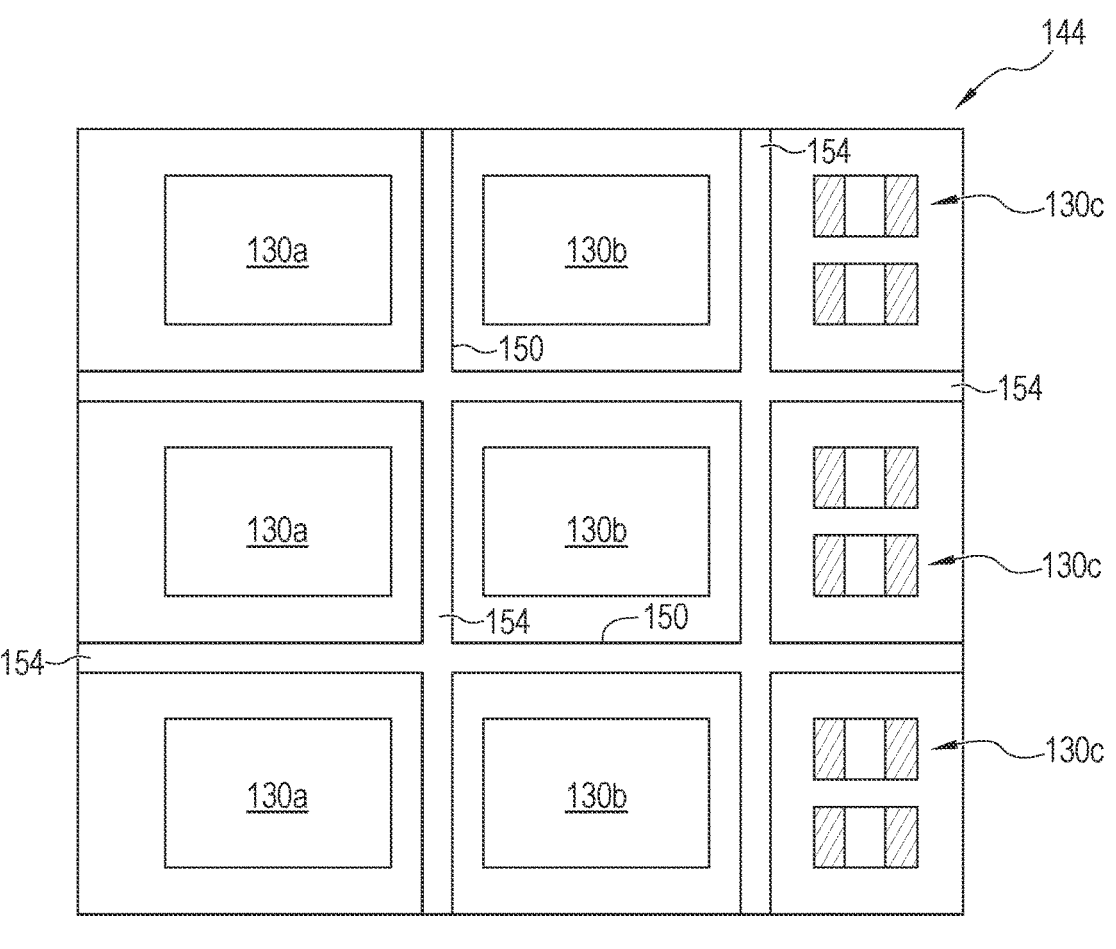

In another embodiment, continuing from FIG. 2d, an opening or slot 150 is formed in encapsulant 140 between electrical components 130a-130c using an etching process or laser direct ablation (LDA) with laser 152, as shown in FIG. 3a. Slot 150 may extend in one or more x-direction channels and one or more y-direction channels, see FIG. 3c. In FIG. 3b, shielding material 154 is deposited in slot 150 between or around electrical components 130a-130c. FIG. 3c is a top view of shielding material 154 deposited in one or more slots 150 to compartmentalize electrical components 130a-130c in the x-direction and y-direction.

Figure 3D:
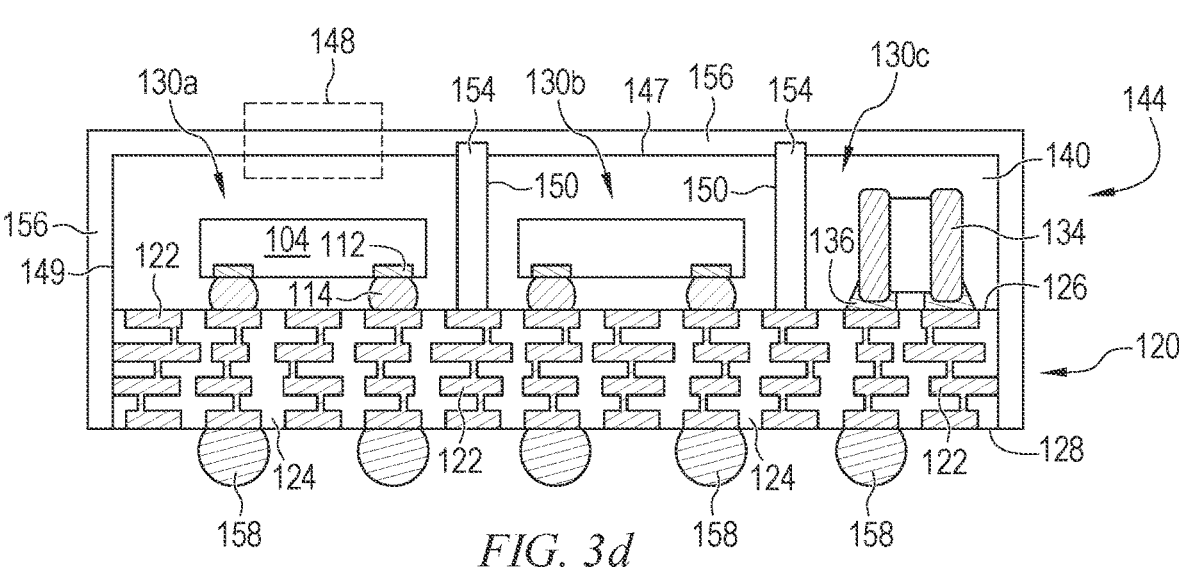

In FIG. 3d, shielding layer 156 is deposited, printed, or otherwise formed on surfaces 147 and 149 of encapsulant 140. Shielding layer 156 can be one or more layers of a matrix, such as thermal set material or polymer, with graphene covered cores embedded within the matrix, see further description in FIGS. 4a-4b and 5a-5c. Alternatively, shielding layer 156 can be carbonyl iron, stainless steel, nickel silver, low-carbon steel, silicon-iron steel, foil, conductive resin, carbon-black, aluminum flake, Cu, Sn, Ni, Au, Ag, and other metals and composites capable of dissipating charged particles to ground. Shielding layer 156 is grounded through shielding material 154 and interconnect substrate 120. The compartments defined by shielding material 154 isolate electrical components 130a-130c as necessary to address the effects of EMI, RFI, and other inter-device interference. For example, shielding material 154 and shielding layer 156 isolate electrical component 130a and electrical component 130b to reduce or inhibit the effects of EMI, RFI, and other inter-device interference. Shield material 154 and shielding layer 156 isolate electrical component 130b and electrical component 130c for a similar purpose. The text relative to shielding layer 156 applies to shielding layer 146 and shielding material 154, and vice versa.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 158. In one embodiment, bump 158 is formed over a UBM having a wetting layer, barrier layer, and adhesive layer. Bump 158 can also be compression bonded or thermocompression bonded to conductive layer 122. In one embodiment, bump 158 is a copper core bump for durability and maintaining its height. Bump 158 represents one type of interconnect structure that can be formed over conductive layer 122. The interconnect structure can also use bond wires, conductive paste, stud bump, micro bump, or other electrical interconnect.

Figure 4A:
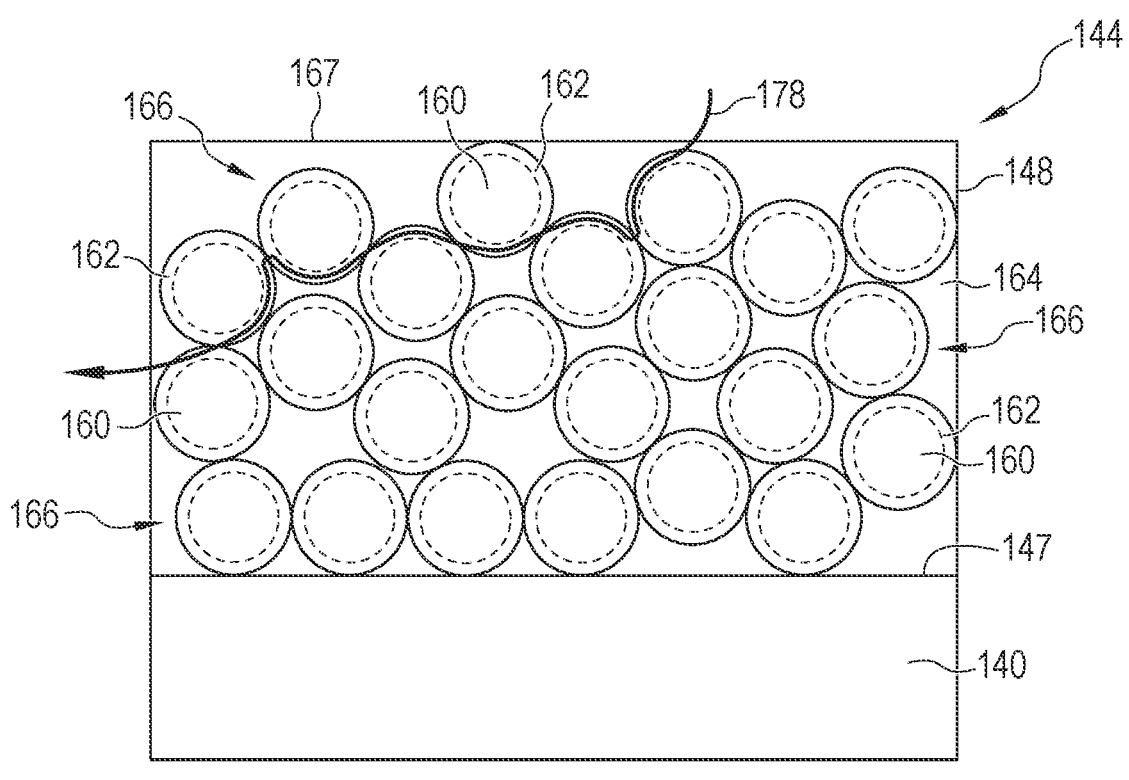
FIGS. 4a-4b illustrate further detail of the graphene core shell within the shielding layer.
Figure 4B:
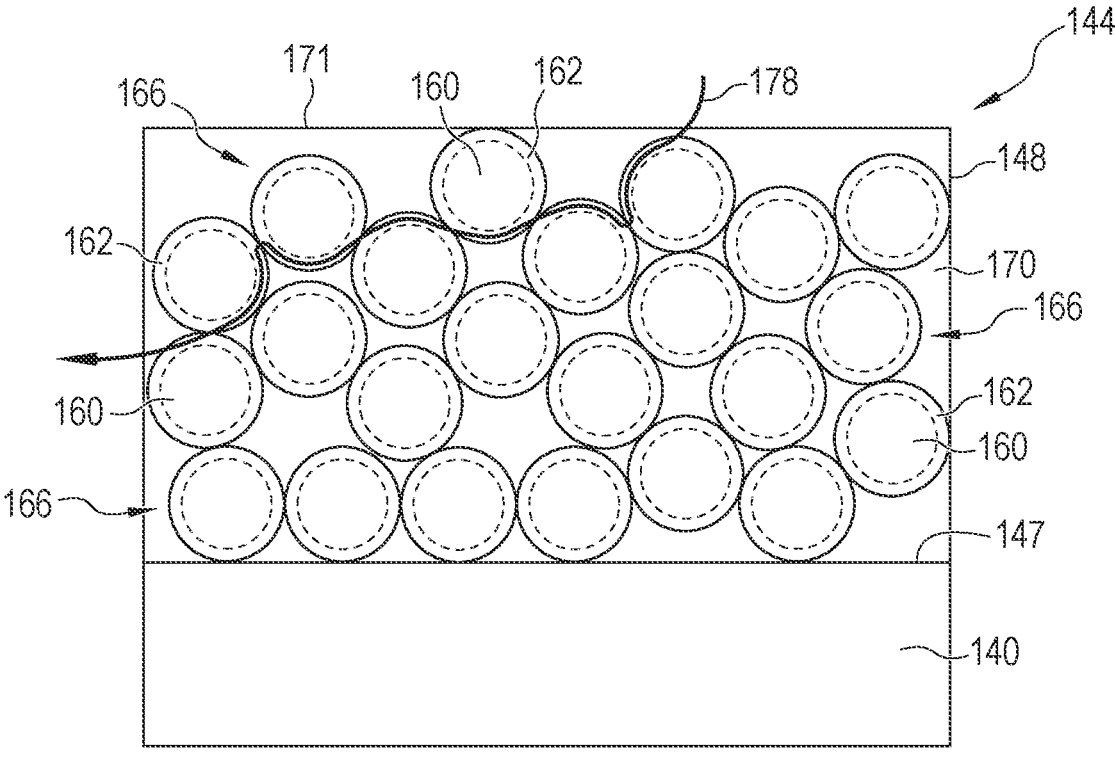

FIGS. 4a and 4b show further detail of region or box 148 from FIGS. 2e and 3d. In one embodiment, shielding layer 146 includes matrix 164 and a plurality of cores 160 with graphene coating 162 embedded within the matrix, as shown in FIG. 4a. In one embodiment, matrix 164 is a thermoset material, such as epoxy resin or adhesive with binder and filler containing alumina, Al, aluminum zinc oxide, or other material having good conductive properties. Matrix 164 can be thermal grease such as silicon or polymer type such as polymethyl methacrylate (PMMA) or polyethylene terephthalate (PET).

In another embodiment, matrix 170 is a polymer or composite epoxy with dispersed graphene, carbon nanotubes, conductive polymers, and the like, as shown in FIG. 4b. For example, matrix 170 can be a Ag ink epoxy for shielding layers 146 and 156 and compartmental shielding material 154. As the number of filter die and chip density is increased for acting from various frequencies, the more effective electromagnetic compatibility is needed.

Each core 160, as embedded in matrix 164 or matrix 170, is surrounded or covered by graphene coating or shell 162. In one embodiment, a graphene paste or ink is formed around a Cu core as core shell 166. Graphene coating 162 of each core 160 contacts the graphene coating of an adjacent core. Cores 160 have sufficient density that most if not all the graphene coatings around the cores contact at least one graphene coating around an adjacent core, and typically contact graphene coating of multiple adjacent cores. In FIG. 4a, core shells 166 occupy space within matrix 164 between surface 167 of the matrix and surface 147 of encapsulant 140. In FIG. 4b, core shells 166 occupy space within matrix 170 between surface 171 of the matrix and surface 147 of encapsulant 140.

Figures 5A, 5B, 5C:
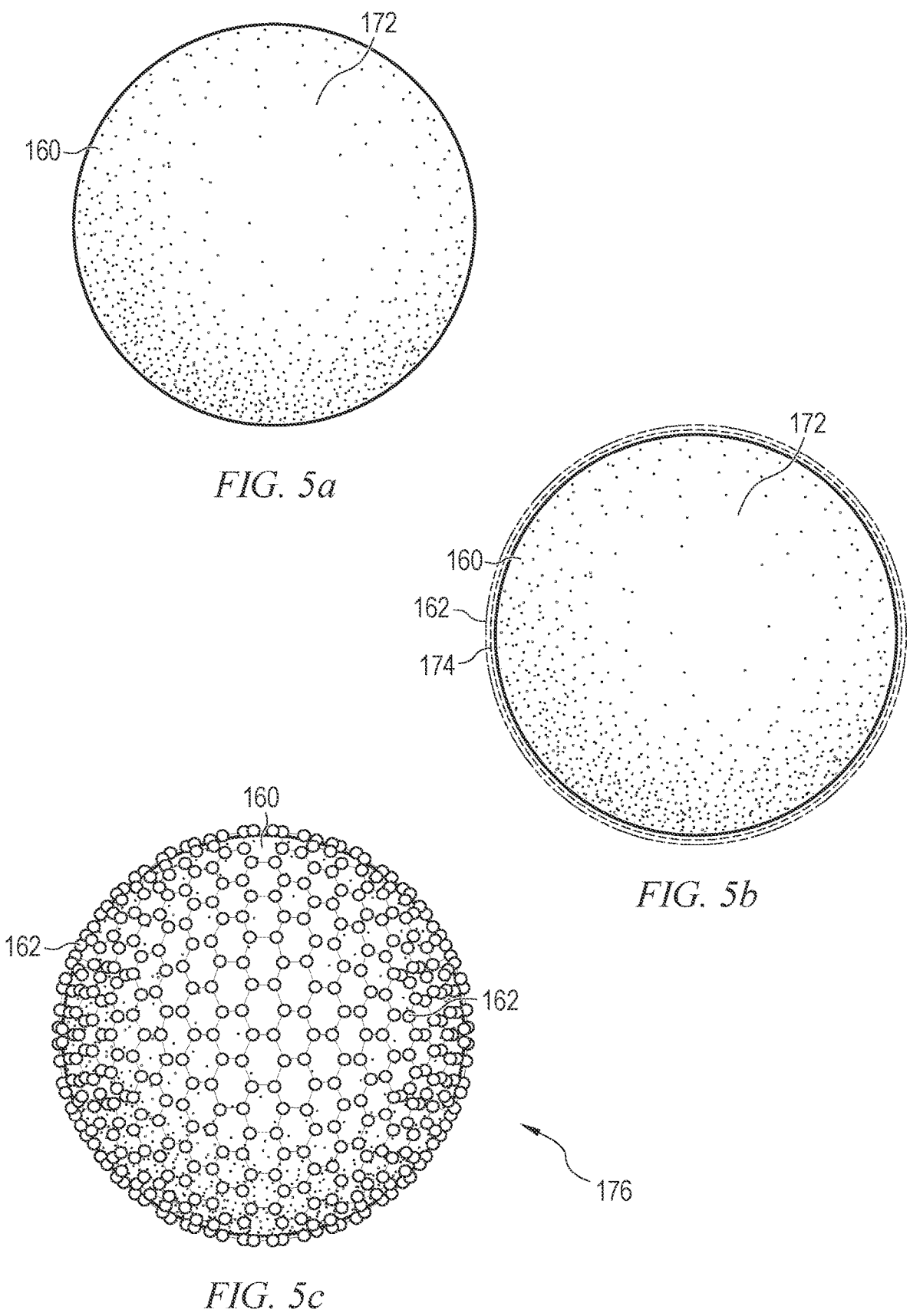
FIGS. 5a-5c illustrate a process of forming a graphene core shell.

FIG. 5a illustrates further detail of core 160, graphene 162, and core shell 166. In one embodiment, core 160 is Cu, Ni, phase change material (PCM), or other suitable metal or similar material. FIG. 5b illustrates graphene coating 162 formed around surface 172 of core 160. FIG. 5c illustrates further detail of graphene coating 162 formed as a mesh network around surface 172 of core 160, collectively graphene core shell 166. Graphene 162 is an allotrope of carbon with one or more layers of carbon atoms each arranged in a two-dimensional (2D) honeycomb lattice. Graphene coating 162 can be formed by CVD. Core 160 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 162 on surface 172 of core 160. The release of carbon atoms over core 160 forms a continuous sheet of graphene coating 162. Additional information related to forming graphene coating by CVD is disclosed in U.S. Pat. No. 8,535,553, and hereby incorporated by reference.

Core 160 is PCM capable of phase change from solid to liquid phase or from liquid phase to solid phase within the operating temperature range of the semiconductor chip, e.g., 20-200° C. A first coating 174 is formed around PCM core 160, as shown in FIG. 5b and discussed in published Korean application KR101465616B1. The first coating 174 can be a polymer intermediate layer. A second coating 162 is formed over the first coating 174. Matrix 164 with graphene covered core is further disclosed in U.S. patent Ser. No. 10/421,123, and hereby incorporated by reference.

The properties of graphene are summarized in Table 1, as follows:

TABLE 1

Properties of graphene

| Parameter | |
| --- | --- |
| Electronic mobility | $2 \times 10^5$ $cm^2$ $V^{-1}$ $s^{-1}$ |
| Current density | $10^9$ A $cm^{-1}$ |
| Velocity of fermion (electron) | $10^6$ m $s^{-1}$ |
| Thermal conductivity | 4000-5000 W $m^{-1}$ $K^{-1}$ |
| Tensile strength | 1.5 Tpa |
| Breaking strength | 42N $m^{-1}$ |
| Transparency | 97.7% |
| Elastic limit | 20% |
| Surface area | 2360 $m^2$ $g^{-1}$ |

Returning to FIGS. 4a and 4b, the plurality of graphene core shells 166 physically contacts adjacent graphene core shells within matrix 164 to create an electrically conductive path 178 including portions of interconnected graphene coating 162 on adjacent core shells 166 disposed and extending between surface 167 and surface 147. The electrically conductive path 178 dissipates any charge incident on shielding layer 146, such as an EMI or RFI, to ground. The dissipation of charges through many electrically conductive paths like 178 in core shells 166 operates to reduce or inhibit the effects of EMI, RFI, and other inter-device interference. The features of FIGS. 4a-4b and 5a-5c applies for shielding layers 146 and 156 and shielding material 154.

Graphene 162 has ten times the electrical conductivity of Cu. Graphene 162 enables epoxy to exhibit electrical conductivity similar to Ag. Graphene 162 prevents oxidation to increase the EMI shielding property of epoxy. Core shell 166 with Cu and graphene epoxy is low cost, as compared to sputtering, and with good EMI shielding properties. Graphene 162 has a low moisture permeability and a high thermal conductivity of 4000-5000 W $m^{-1}$ $K^{-1}$, 10 times higher than Cu at room temperature. Since carbon also has a good solderability and wettability of solder paste, shielding layer 146 can be readily formed. Graphene 162 exhibits a high degree of flexibility and remains stable against warpage. Shielding layer 146 with graphene Cu shell 166 improves electrical conductivity, while lowering manufacturing cost.

Figure 6A:
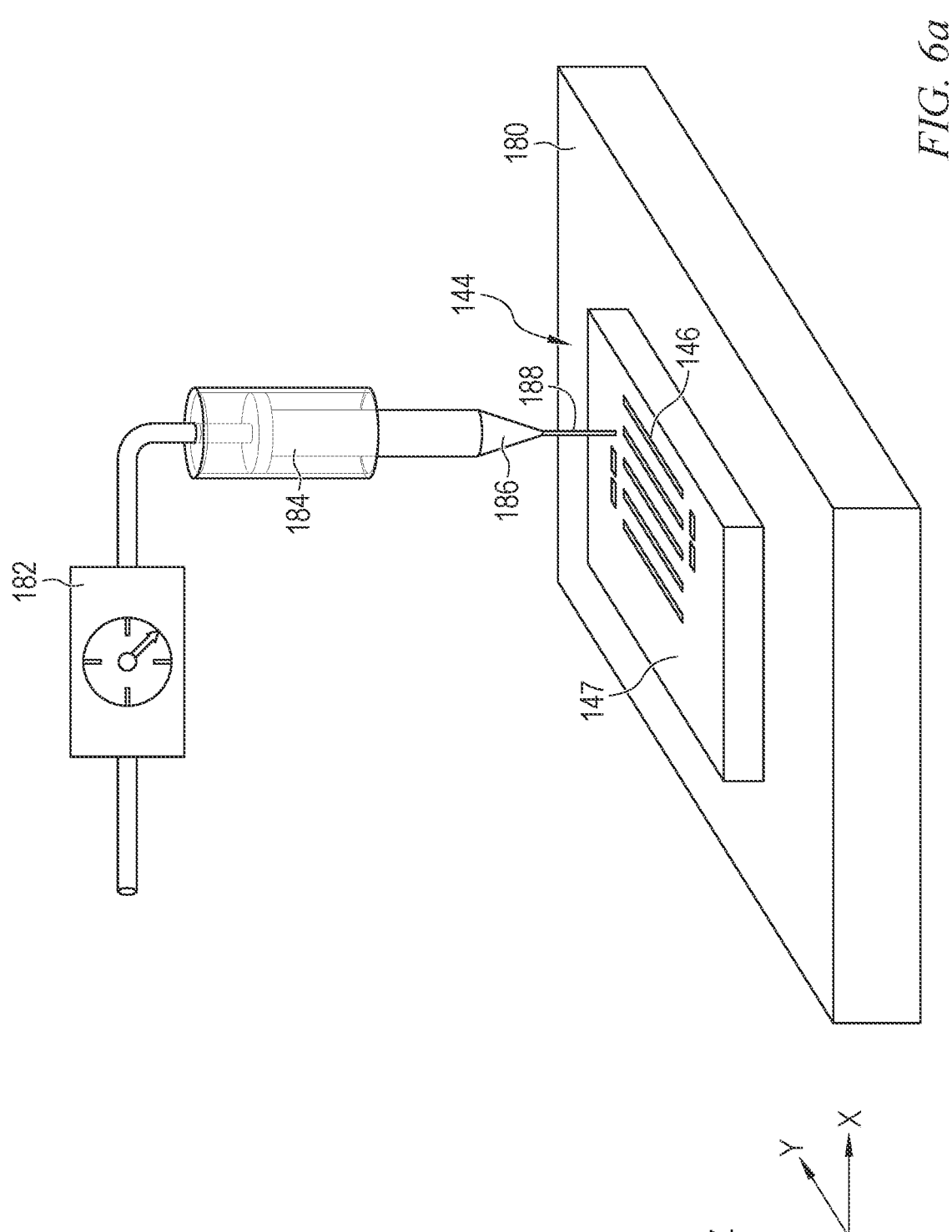
FIGS. 6a-6b illustrate using EHD jet printing to deposit the shielding material over a surface of the SiP.
Figure 6B:
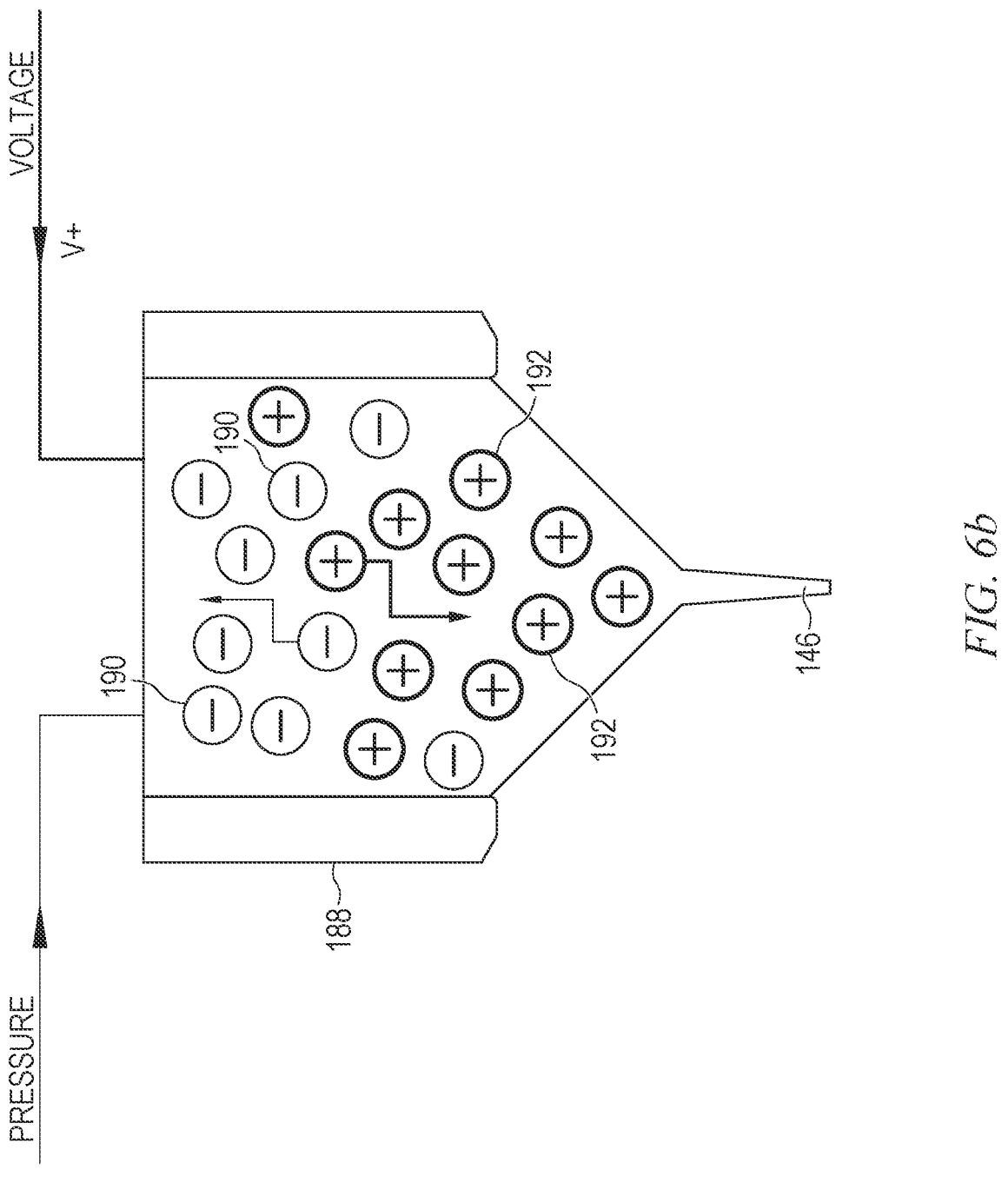

FIG. 6a shows depositing shielding layer 146 over surface 147 of encapsulant 140 in SiP 144 using electrohydrodynamic (EHD) jet printing. SiP 144 is placed on substrate 180 capable of three dimensional (x, y, z directions) movement to control distribution of shielding material on surface 147. Pneumatic regulator 182 with pressure gauge applies pressure to syringe pump 184 containing shielding material, such as conductive and non-conductive ink. Conical section 186 narrows the ink path to injection nozzle 188, which deposits the ink on surface 147 of encapsulant 140 in a controlled manner. More specifically, injection nozzle 188 performs ink jetting by an electric field and pressure between the nozzle and substrate. In FIG. 6b, pressure is applied from pneumatic regulator 182. A voltage source induces an electric field shown as negative charges positive charges 190. The printed liquid, i.e., shielding layer 146, is driven by the electric field to achieve direct pattern, high resolution printing of shielding layer 146. The same applies for shielding layer 156 and shielding material 154.

Figure 7:
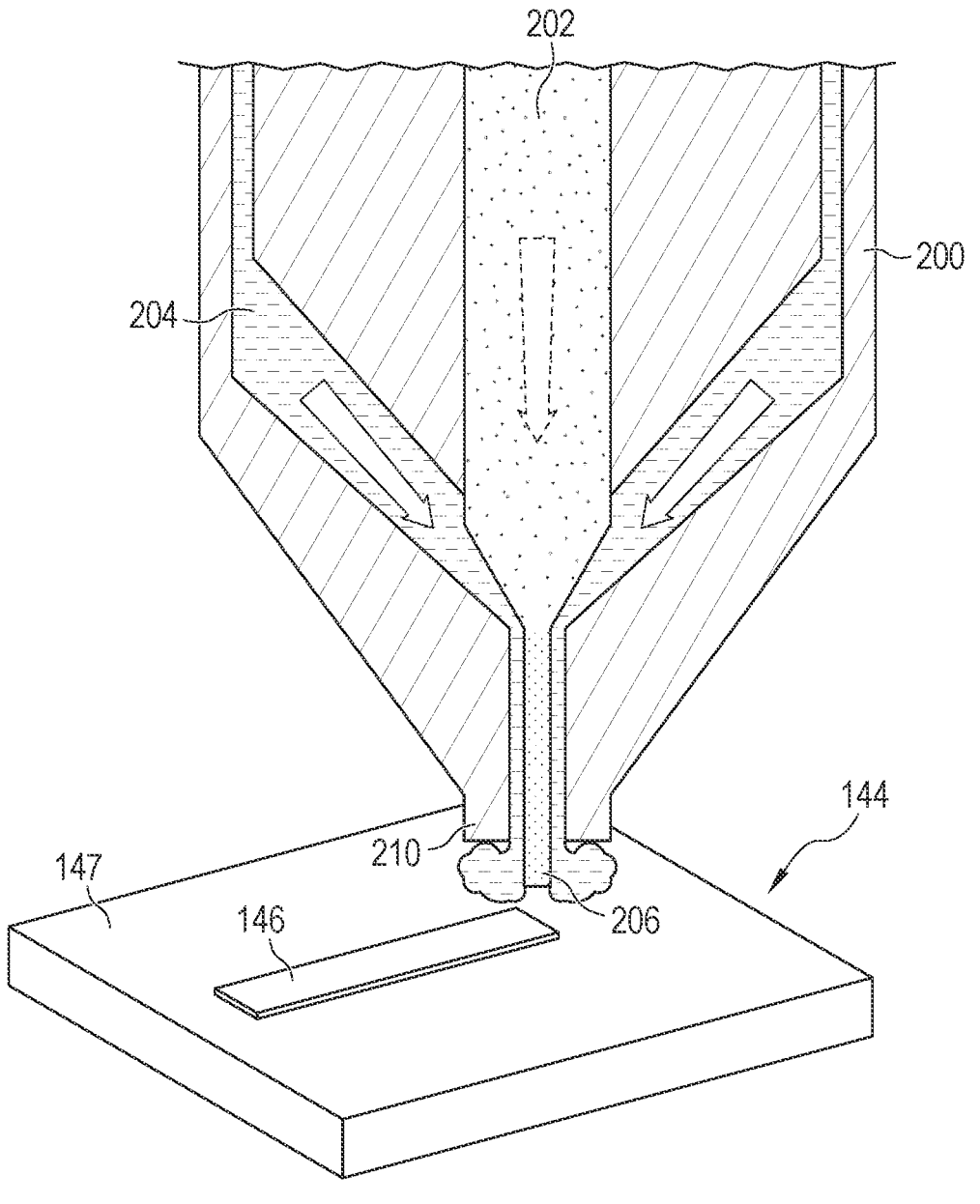
FIG. 7 illustrates using aerosol jet printing to deposit the shielding material over a surface of the SiP.

FIG. 7 shows depositing shielding layer 146 over surface 147 of encapsulant 140 in SiP 144 using aerosol jet printing. Dispenser 200 includes channel 202 for the flow of shielding material, such as conductive and non-conductive ink, and channel 204 for the flow of a gas, such as nitrogen. The shielding material is mixed with the gas and deposit the ink from nozzle or head 210 on surface 147 of encapsulant 140 as an aerosol jet. The printed liquid, i.e., shielding layer 146 is dispensed as a jetting of aerosol focused by sheath gas at the end of head 210. The features of FIGS. 6a-6b and 7 apply for shielding layers 146 and 156 and shielding material 154.

Figure 8:
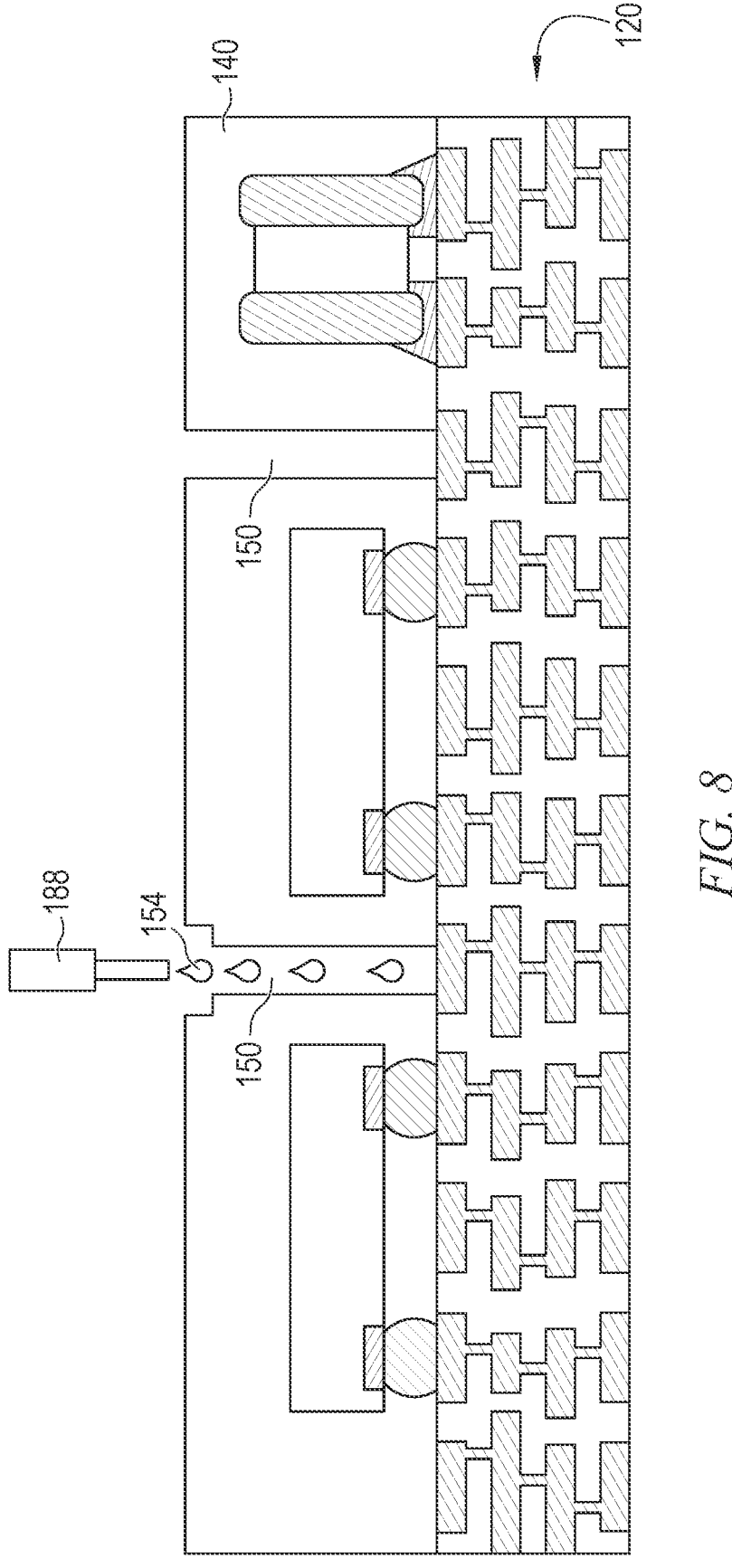
FIG. 8 illustrates depositing the shielding material in the trench of the encapsulant.

FIG. 8 shows depositing shielding material 154 into trench 150 using EHD jet printing from FIGS. 6a-6b.

Figure 9:
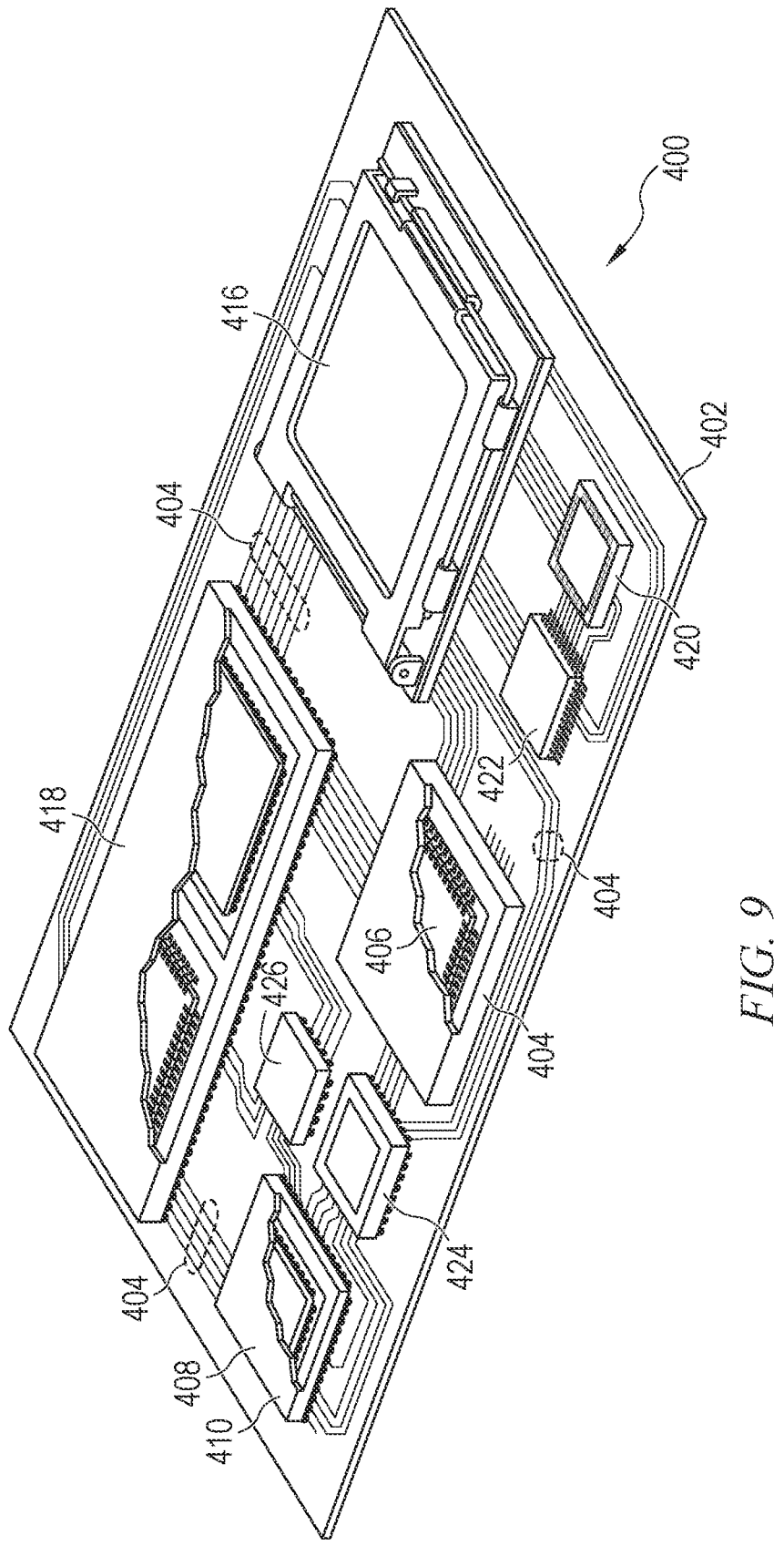
FIG. 9 illustrates a printed circuit board (PCB) with different types of packages disposed on a surface of the PCB.

FIG. 9 illustrates electrical device 400 having a chip carrier substrate or PCB 402 with a plurality of semiconductor packages disposed on a surface of PCB 402, including SiP 144. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   an electrical component disposed over the substrate;
   an encapsulant deposited over the electrical component and substrate; and
   a shielding layer including a plurality of graphene core shells formed within the shielding layer and in contact with a surface of the encapsulant over the electrical component, wherein each of the graphene core shells are in contact with an adjacent graphene core shell to form a continuous path extending from a first surface of the shielding layer to the surface of the encapsulant.

2. The semiconductor device of claim 1, wherein the graphene core shell includes a copper core.

3. The semiconductor device of claim 1, wherein the shielding layer is printed on the surface of the encapsulant.

4. The semiconductor device of claim 1, wherein the shielding layer includes a plurality of cores covered by graphene and the graphene is formed as a mesh network in a honeycomb lattice over the cores and the graphene over the cores is in contact continuously between the surface of the shielding layer and the surface of the encapsulant to form the continuous path extending from the surface of the shielding layer to the surface of the encapsulant.

5. The semiconductor device of claim 1, wherein the shielding layer includes thermoset material or polymer or composite epoxy type matrix and the graphene core shell is embedded within the thermoset material or polymer or composite epoxy type matrix.

6. The semiconductor device of claim 1, further including a shielding material disposed around the electrical component.

7. A semiconductor device, comprising:
   an electrical component;
   an encapsulant deposited over the electrical component; and
   a shielding layer including a plurality of graphene core shells formed within the shielding layer and in contact with a surface of the encapsulant over the electrical component, wherein each of the graphene core shells are in contact with an adjacent graphene core shell to form a continuous path extending through the shielding layer to the surface of the encapsulant.

8. The semiconductor device of claim 7, wherein the graphene core shell includes a copper core.

9. The semiconductor device of claim 7, wherein the shielding layer is printed on the surface of the encapsulant.

10. The semiconductor device of claim 7, wherein the shielding layer includes a plurality of cores covered by graphene and the graphene is formed as a mesh network in a honeycomb lattice over the cores and the graphene over the cores is in contact continuously between the surface of the shielding layer and the surface of the encapsulant to form the continuous path extending through the shielding layer to the surface of the encapsulant.

11. The semiconductor device of claim 7, wherein the shielding layer includes thermoset material or polymer or composite epoxy type matrix and the graphene core shell is embedded within the thermoset material or polymer or composite epoxy type matrix.

12. The semiconductor device of claim 7, further including a shielding material disposed around the electrical component.

13. The semiconductor device of claim 7, further including a substrate, wherein the electrical component is disposed over the substrate.

14. A method of making a semiconductor device, comprising:
   providing a substrate;
   disposing an electrical component over the substrate;
   depositing an encapsulant over the electrical component and substrate; and
   forming a shielding layer including a plurality of graphene core shells within the shielding layer and in contact with a surface of the encapsulant over the electrical component, wherein each of the graphene core shells are in contact with an adjacent graphene core shell to form a continuous path extending from a first surface of the shielding layer to the surface of the encapsulant.

15. The method of claim 14, wherein the graphene core shell includes a copper core.

16. The method of claim 14, further including printing the shielding layer on the surface of the encapsulant.

17. The method of claim 14, wherein the shielding layer includes a plurality of cores covered by graphene and the graphene is formed as a mesh network in a honeycomb lattice over the cores and the graphene over the cores is in contact continuously between the surface of the shielding layer and the surface of the encapsulant to form the continuous path extending through the shielding layer to the surface of the encapsulant.

18. The method of claim 14, wherein the shielding layer includes thermoset material or polymer or composite epoxy type matrix and the graphene core shell is embedded within the thermoset material or polymer or composite epoxy type matrix.

19. The method of claim 14, further including disposing a shielding material around the electrical component.

20. A method of making a semiconductor device, comprising:
   providing an electrical component;
   depositing an encapsulant over the electrical component; and
   forming a shielding layer including a plurality of graphene core shells within the shielding layer and in contact with a surface of the encapsulant over the electrical component, wherein each of the graphene core shells are in contact with an adjacent graphene core shell to form a continuous path extending through the shielding layer to the surface of the encapsulant.

21. The method of claim 20, wherein the graphene core shell includes a copper core.

22. The method of claim 20, further including printing the shielding layer on the surface of the encapsulant.

23. The method of claim 20, wherein the shielding layer includes a plurality of cores covered by graphene and the graphene is formed as a mesh network in a honeycomb lattice over the cores and the graphene over the cores is in contact continuously between the surface of the shielding layer and the surface of the encapsulant to form the continuous path extending through the shielding layer to the surface of the encapsulant.

24. The method of claim 20, wherein the shielding layer includes thermoset material or polymer or composite epoxy type matrix and the graphene core shell is embedded within the thermoset material or polymer or composite epoxy type matrix.

25. The method of claim 20, further including disposing a shielding material around the electrical component.

* * * * *